United States Patent
Ogasawara (10) Patent No.: US 6,377,428 B1
(45) Date of Patent: Apr. 23, 2002

(54) SWITCHING DEVICE HAVING THE CAPABILITY OF DETECTING AN ABNORMALITY

(75) Inventor: Kazuyoshi Ogasawara, Shizuoka (JP)

(73) Assignee: Yakaki Corporation, Tokyo (JP)

( * ) Notice: Subject to any disclaimer, the term of this patent is extended or adjusted under 35 U.S.C. 154(b) by 0 days.

(21) Appl. No.: 09/514,182

(22) Filed: Feb. 28, 2000

(30) Foreign Application Priority Data

Feb. 26, 1999 (JP) .......................................... 11-050118
Jan. 26, 2000 (JP) ....................................... 2000-016686

(51) Int. Cl.⁷ ................................................ H02H 3/18
(52) U.S. Cl. ......................... 361/86; 361/87; 361/93.7
(58) Field of Search ............................. 361/79, 86, 87, 361/93.1, 93.7, 100–101; 327/309–310, 427, 77, 108

(56) References Cited

U.S. PATENT DOCUMENTS

| | | | | |
|---|---|---|---|---|
| 5,113,089 A | * | 5/1992 | Osawa | 327/77 |
| 5,361,008 A | | 11/1994 | Saijo | 327/427 |
| 6,229,355 B1 | * | 5/2001 | Ogasawara | 327/108 |

FOREIGN PATENT DOCUMENTS

| | | | | |
|---|---|---|---|---|
| JP | 1-1227520 | 9/1989 | .......... | H03K/17/08 |
| JP | 2-266836 | 10/1990 | .............. | H02J/7/10 |
| JP | 3-262209 | 11/1991 | .......... | H03K/17/08 |
| JP | 4-134271 | 5/1992 | .......... | G01R/19/165 |
| JP | 5-52880 | 3/1993 | .......... | G01R/19/165 |
| JP | 6-27157 | 2/1994 | .......... | G01R/19/165 |
| JP | 6-61432 | 3/1994 | .......... | H01L/27/06 |
| JP | 6-188704 | 7/1994 | .......... | H03K/17/08 |
| JP | 6-244414 | 9/1994 | .......... | H01L/29/784 |
| JP | 6-244693 | 9/1994 | .......... | H03K/17/08 |
| JP | 9-145749 | 6/1997 | .......... | G01R/19/00 |

* cited by examiner

*Primary Examiner*—Michael J. Sherry
(74) *Attorney, Agent, or Firm*—Sughrue Mion, PLLC (57) ABSTRACT

A switching device includes a commanding device (813, Q51) which commands a driving of a load, a driving device (111) which outputs a drive signal in response to a drive command signal from the commanding device (813, Q51) and a first switching device (QA) inserted in a power supply circuit connecting a power supply (101) and the load (102). The first switching device (QA) is adapted to conduct in response to the drive signal and close the power supply circuit. A reference resistor (Rr1, Rr2) generates a reference voltage by receiving a current from the power supply, and a second switching device (QB, QC) is inserted in a shunt circuit connecting the power supply and the reference resistor. The second switching device (QB, QC) is adapted to conduct in response to the drive signal and close the shunt circuit. An abnormality determining device (CMP1, CMP2) determines an abnormality by comparing an output voltage from the first switching device (QA) and the reference voltage. A cutoff latch device 306, Q53) changes the drive command signal outputted to the driving device (111) into a stop command signal in response to an abnormality determination signal of the abnormality determining device (CMP1, CMP2). A monitoring device (811) monitors a state of the load (102) on the basis of a state of the command signal inputted to the driving device (111).

4 Claims, 5 Drawing Sheets

SWITCHING DEVICE HAVING THE CAPABILITY OF DETECTING AN ABNORMALITY

BACKGROUND OF THE INVENTION

1. Field of the Invention

The present invention relates to a switching device, and more particularly to a switching device for controlling the supply of electric power from a power supply to a load by detecting an abnormality.

The present application is based on Japanese Patent Applications Nos. Hei. 11-50118 and 2000-16686, which are incorporated herein by reference.

2. Description of the Related Art

A switching device is used for controlling the supply of electric power from a power supply to each load in, for example, an automobile. A related switching device is comprised of a semiconductor element for effecting changeover between the supply and cutoff of electric power as well as its drive circuit; an abnormality determining circuit including a shunt resistor inserted between the power supply and the semiconductor element and a comparator for comparing the voltage across the shunt resistor; an A/D converter for effecting analog-digital conversion of a determination signal from the abnormality determining circuit; and a controlling device such as a microcomputer for controlling the on/off state of the semiconductor element by commanding the drive circuit on the basis of the converted determination signal.

As the drive circuit outputs a drive signal in response to a command signal from the controlling device, the semiconductor element is turned on, which in turn closes a power supply circuit from the power supply to the load, thereby supplying electric power to the load. At this time, if an abnormality such as an overcurrent occurs, on the basis of a voltage drop at the shunt resistor the abnormality determination circuit detects that an abnormal current exceeding a normal value has occurred, whereupon the controlling device stops the outputting of the drive signal to turn off the semiconductor element, i.e., sets it in a nonconducting state, thereby protecting the semiconductor element or the load.

With the related switching device, since the controlling device such as the microcomputer, the abnormality determination circuit including the shunt resistor, the A/D converter, and the like are required, there is a problem in that the device becomes complex.

SUMMARY OF THE INVENTION

It is an object of the present invention to provide a switching device which is simplified.

To this end, in accordance with a first aspect of the present invention, there is provided a switching device which comprises a driving device which outputs a drive signal in response to a drive command signal, a first switching device inserted in a power supply circuit connecting a power supply and a load, and adapted to conduct in response to the drive signal and close the power supply circuit, a reference resistor which generates a reference voltage by receiving a current from the power supply, a second switching device inserted in a shunt circuit connecting the power supply and the reference resistor, and adapted to conduct in response to the drive signal and close the shunt circuit, an abnormality determining device which determines an abnormality by comparing an output voltage from the first switching device and the reference voltage so as to stop the driving device from outputting the drive signal, an on/off counter circuit which outputs a latch command signal when the first switching device has repeated conduction and nonconduction a set number of times in accordance with the state of the load by monitoring the state of the first switching device, and a cutoff latch circuit which renders the first switching device in a nonconducting state in response to the latch command signal, and latches the nonconducting state.

In the above-described switching device, when a current larger than during normal times flows across a power supply circuit during the occurrence of an abnormality such as a shortcircuiting of the power supply circuit, since the output voltage at the first switching device becomes lower than the reference voltage, the abnormality determining device outputs a determination signal representative of an abnormality to the drive circuit. The drive circuit stops outputting the drive signal, and the first switching device is turned off, i.e., is set in the nonconducting state, thereby stopping the supply of electric power from the power supply to the load. When the supply of electric power is stopped, and the output voltage at the first switching device and the output voltage at the second switching device drop to substantially the same level, the abnormality determining device outputs a determination signal representative of the normal state, and as the driving device outputs the drive signal again, the first switching device is turned on, thereby supplying electric power to the load. As the outputting and stopping of the drive signal are repeated, the first switching device repeats conduction and nonconduction, the frequency of this repetition is counted by the on/off counter circuit. When a predetermined frequency is reached, the first switching device is latched in the off state by the cutoff latch circuit.

Namely, control of the supply of electric power to the load and the cutoff of the supply of electric power during the occurrence of an abnormality is controlled by hardware circuits alone without using a controlling device such as a microcomputer, an abnormality determination circuit including a shunt resistor, an A/D converter, etc.. Further, most of the component elements such as the hardware circuits making up the switching device can be integrated in a single semiconductor chip. In short, the switching device can be simplified.

With the switching device in accordance with the above-described first aspect of the present invention, the determination signal from the abnormality determining device and information on the execution of the latch by the cutoff latch device are arranged to be outputted outside the semiconductor chip, for instance, to such as a microcomputer for managing the switching of each load, and the semiconductor is provided with a plurality of terminals including output terminals therefor.

Accordingly, in accordance with a second aspect of the present invention, there is provided a switching device which comprises a commanding device which commands the driving of a load, a driving device which outputs a drive signal in response to a drive command signal from the commanding device, a first switching device inserted in a power supply circuit connecting a power supply and the load, and adapted to conduct in response to the drive signal and close the power supply circuit, a reference resistor which generates a reference voltage by receiving a current from the power supply, a second switching device inserted in a shunt circuit connecting the power supply and the reference resistor, and adapted to conduct in response to the drive signal and close the shunt circuit, an abnormality determining device which determines an abnormality by comparing an output voltage from the first switching device and the reference voltage, a cutoff latch device which changes the drive command signal outputted to the driving device into a stop command signal in response to an abnormality determination signal of the abnormality determining device, and latches the stop command signal, and a monitoring device which monitors a state of the load on the basis of a state of the command signal inputted to the driving device.

If the switching device is configured as described above, if an abnormality occurs in the load, the cutoff latch circuit changes the drive command signal to the stop command signal in response to the signal from the abnormality determining device, and latches the driving device in a state in which the output of the drive signal is stopped. Further, whether the command signal inputted to the driving device is the drive command signal or the stop command signal is monitored by the monitoring device. The monitoring device is able to detect the occurrence of an abnormality as the command signal inputted to the driving device is changed to the stop command signal when the commanding device is commanding the drive, and is also able to detect that the first switching device is being latched in the nonconducting state. For this reason, the outputting of information on abnormality determination and the execution of the latch can be effected by the terminal for imparting the command signal to the driving device. Hence, terminals for outputting the determination signal from the abnormality determining device and for outputting information on the execution of the latch by the cutoff latch device become unnecessary. In other words, it is possible to reduce the number of terminals of the semiconductor chip which increase connections and make the device complex. Namely, the switching device can be made further simplified.

In addition, in the above-described second aspect of the present invention, the abnormality determining device may include a first abnormality determining device which determines an abnormality when the output voltage from the first switching device is lower than the reference voltage.

Furthermore, in the above-described second aspect of the present invention, the abnormality determining device may include a second abnormality determining device which determines an abnormality when the output voltage from the first switching device is higher than the reference voltage.

The above and other objects, features and advantages of the present invention will become more apparent from the following detailed description of the present invention when read in conjunction with the accompanying drawings.

DETAILED DESCRIPTION OF THE PREFERRED EMBODIMENTS

Figure 1:
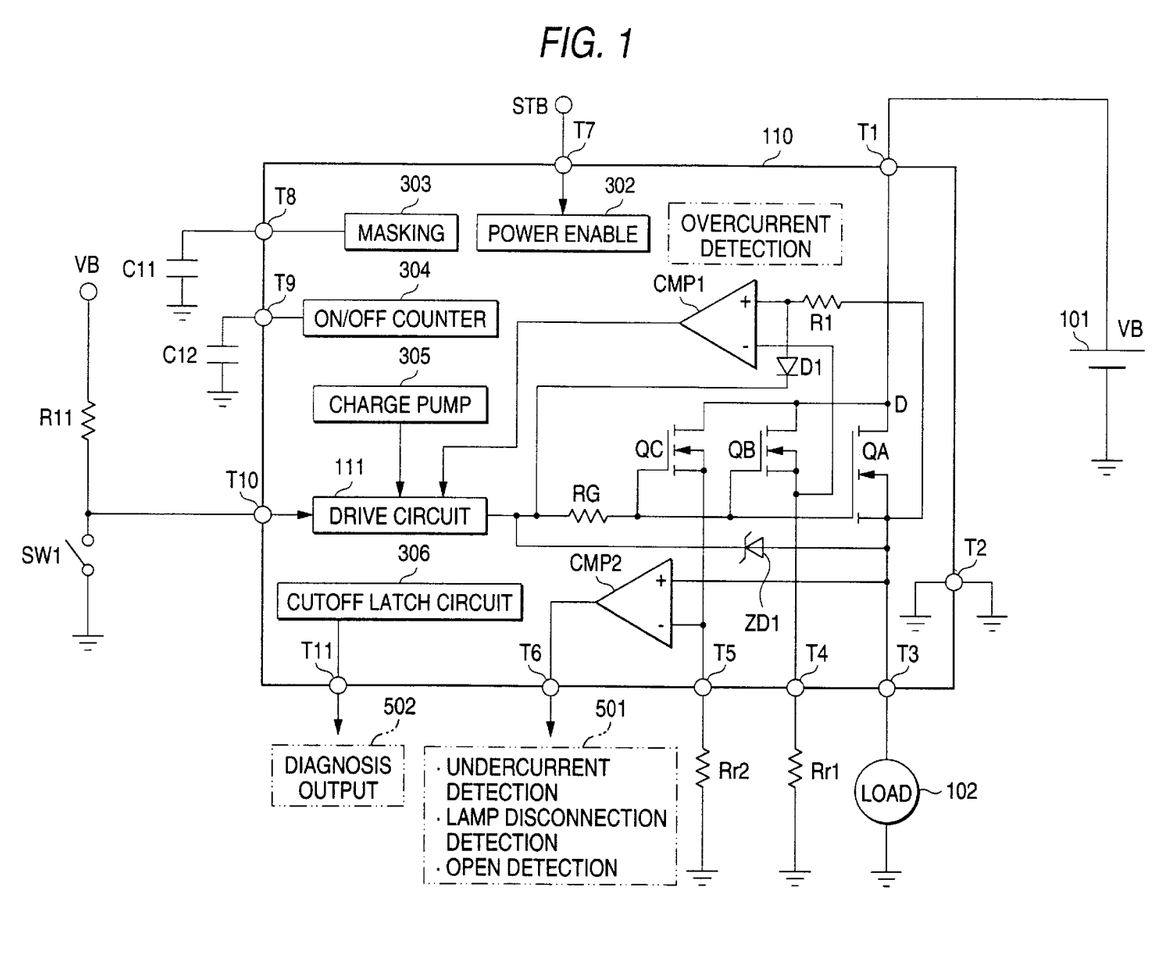
FIG. 1 is a block diagram of an embodiment of the switching device with a current-oscillating type circuit-breaking function which shows the basis of the present invention.

First, before giving a detailed description of an embodiment of the present invention, a description will be given of a general configuration of a switching device with a current-oscillating type circuit-breaking function and an outline of its operation with reference to FIGS. 1 to 3. As shown in FIG. 1, the switching device with a current-oscillating type circuit-breaking function is configured as a semiconductor integrated circuit (power IC) in which various circuit elements are integrated on a semiconductor chip 110. A power supply terminal T1 is connected to a power supply 101 with an output voltage VB (e.g., +12 volts), a grounding terminal T2 is grounded, and output terminal T3 is connected to a load 102.

An n-channel FET QA with a built-in temperature sensor is integrated on the semiconductor chip 110 as a semiconductor device (power device) having a heat-sensitizing circuit-breaking function. The FET QA with a built-in temperature sensor has a drain electrode connected to the power supply 101 through a drain terminal D and the power supply terminal T1, a source electrode connected to the load 102 through the output terminal T3, and a gate electrode connected to a drive circuit 111 through a gate terminal TG and a resistor RG. The FET QA with a built-in temperature sensor serves as a first switching device which is inserted in a power supply circuit connecting the power supply 101 and the load 102 and conducts (switches on) in response to a drive signal (on-pulse signal) inputted to the gate terminal TG so as to close the power supply circuit. N-channel FETs QB and QC are integrated as reference devices in parallel with the FET QA with a built-in temperature sensor.

The FET QB has a drain electrode connected to the power supply 101 through the drain terminal D and the power supply terminal T1, a source electrode connected to a first reference resistor Rr1 through an output terminal T4, and a gate electrode connected to the resistor RG through the gate terminal TG. The FET QC has a drain electrode connected to the power supply 101 through the drain terminal D and the power supply terminal T1, a source electrode connected to a second reference resistor Rr2 through an output terminal T5, and a gate electrode connected to the resistor RG through the gate terminal TG. The FET QB serves as a second switching device which conducts in response to the drive signal (on-pulse signal) inputted to the gate terminal TG so as to close a shunt circuit connecting the power supply terminal T1 and the first reference resistor Rr1. The FET QC serves as a third switching device which conducts in response to the drive signal (on-pulse signal) inputted to the gate terminal TG so as to close a shunt circuit connecting the power supply terminal T1 and the second reference resistor Rr2.

As the FETs QA, QB, and QC, it is possible to use power MOSFETs of, for example, a double diffusion MOS (DMOS) structure, a V-grooved MOS (VMOS) structure, or a U-grooved MOS (UMOS) structure, or MOSFETs having similar structures, and it is also possible to use MOS-combining type devices such as ESTs and MOS-controlled thyristors (MCTs) or other insulated-gate type power devices such as insulated gate drive bipolar transistors (IGBTs). Further, junction type FETs, junction type SITs or SI thyristors may be used if those are operated in a state that its gates are always reverse biased. Furthermore, as the FETs QA, QB, and QC used for the power IC, either the n-channel type or the p-channel type may be used.

In addition, the FET QA with a built-in temperature sensor, FET QB, and FET QC are configured by using, for instance, power devices of the multi-channel structure in which a plurality of unit cells are connected in parallel, and the FETs are arranged adjacent to each other. The current capacities of the FETs QB and QC are set to be smaller than the current capacity of the FET QA. This setting is adjusted by the number of parallel-connected unit cells which make up the FETs QB and QC. For example, the configuration provided is such that the number of unit cells of the FET QA is 1,000 where the number of unit cells of the FET QB is 1, and the ratio between the channel widths W of the FET QB and the FET QA is set to be 1:1,000, for example.

Further, the source terminal S of the FET QA is connected to plus input terminals of a comparator CMP1 and a comparator CMP2, respectively; the source electrode of the FET QB is connected to a minus input terminal of the comparator CMP1; and the source electrode of the FET QC is connected to a minus input terminal of the comparator CMP2. An output terminal of the comparator CMP1 is connected to the drive circuit 111, and an output terminal of the comparator CMP2 is connected to an abnormality detecting unit 501 for effecting undercurrent detection, lamp disconnection detection, and open detection through an output terminal T6 of the semiconductor chip 110. Incidentally, the source terminal S of the FET QA is connected to the drive circuit 111 through a zener diode ZD1, and this zener diode is disposed so as to maintain the voltage between the gate terminal TG and the source terminal S of each of the FET QA, the FET QB, and the FET QC and to bypass an overvoltage when the overvoltage is applied to the gate terminal TG.

Meanwhile, a power enable portion 302, a masking circuit 303, an on/off counter circuit 304, a charge pump circuit 305, and a cutoff latch circuit 306 (see Unexamined Japanese Patent Publication No. Hei. 6-244414) are integrated on other regions of the semiconductor chip 110. The power enable portion 302 is connected to a terminal T7, the masking circuit 303 is connected to a capacitor C11 through a terminal T8, the on/off counter circuit 304 is connected to a capacitor C12 through a terminal T9, the drive circuit 111 is connected to a switch SW1 and a resistor R11 through an input terminal T10; and the cutoff latch circuit 306 is connected to a diagnosis output unit 502 through an output terminal T11.

It should be noted that the masking circuit 303 is used to eliminate or mask a rush current which occurs when the FET QA is turned on and the current begins to flow across the load. In cases where the rush current does not present a problem, the masking circuit 303 and its accompanying terminal T8 and capacitor C11 may not be provided. In addition, if there is no need to output the result of diagnosis, the diagnosis output unit (diagnosis result output unit) 502 and its accompanying terminal T11 may not be provided.

Figure 2:
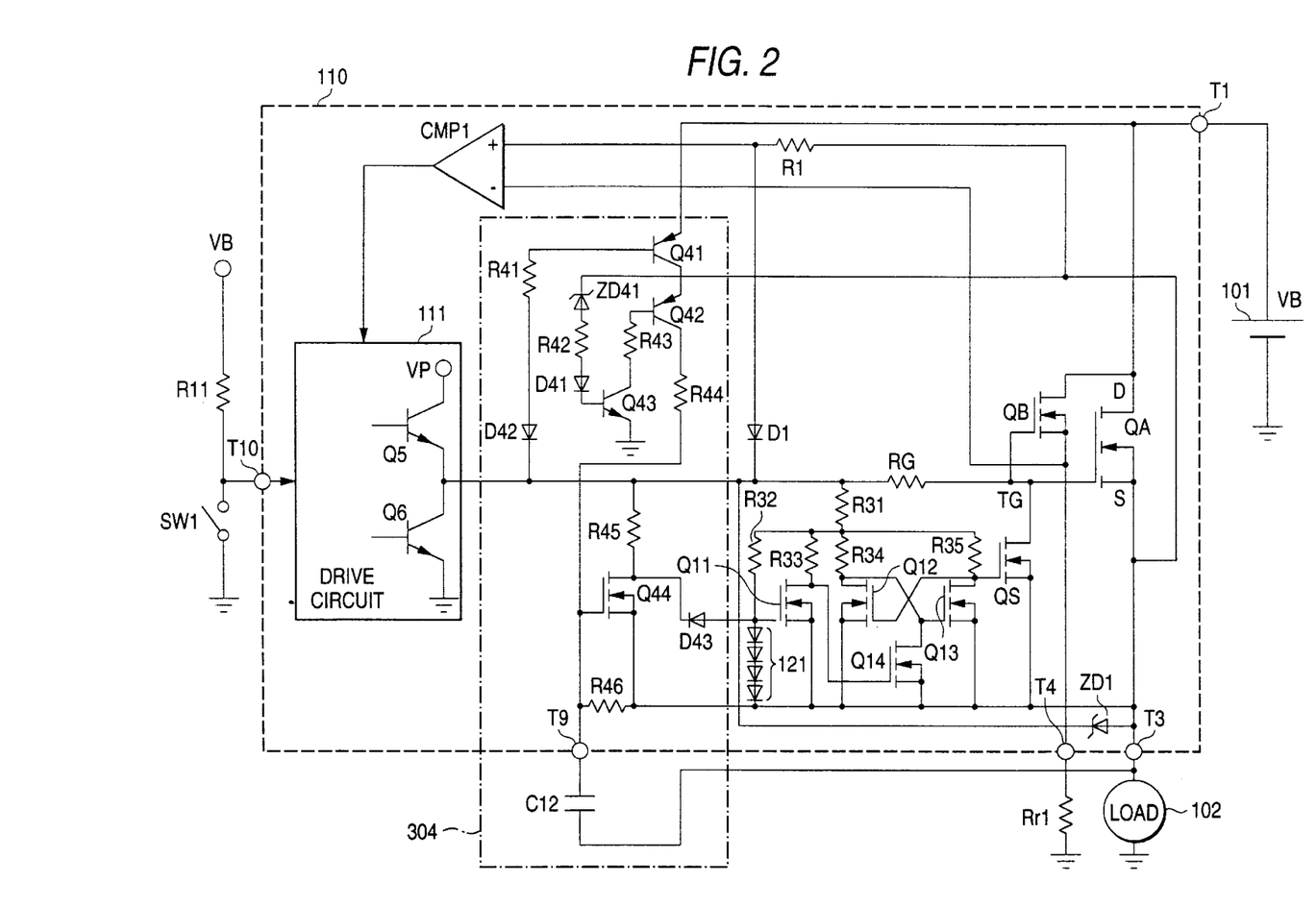
FIG. 2 is a circuit diagram of essential portions of the switching device shown in FIG. 1.

As shown in FIG. 2, the drive circuit 111 has a source transistor Q5 and a synchronous transistor Q6, and has drive elements and inverters for on-off control of the respective transistors. The transistors Q5 and Q6 are connected in series. The collector of the source transistor Q5 is connected to a terminal at a potential VP, and the emitter thereof is connected to the gate terminal TG through the resistor RG. The collector of the synchronous transistor Q6 is connected to the gate terminal TG through the resistor RG, while the emitter thereof is connected to ground potential (GND). The terminal at potential VP is connected to the charge pump circuit 305, and by the output of the charge pump circuit 305 the potential VP of this terminal is set to a voltage higher than that at the power supply 101, e.g., 12V+10V if the voltage at the power supply 101 is 12V.

The drive circuit 111 serves as a driving device in which, when the switch SW1 is thrown and the input terminal T10 is grounded through the switch SW1, the source transistor Q5 is turned on in response to a command signal from the input terminal T10, thereby outputting a high-level drive signal (on-pulse signal) to the output terminal (the point of contact between the transistor Q5 and the transistor Q6). Meanwhile, when the switch SW1 is opened, since the voltage from the power supply 101 is applied to the input terminal T10 through the resistor R11, the synchronous transistor Q6 is turned on, thereby shifting the level of the output terminal (the point of contact between the transistor Q5 and the transistor Q6) to a low level. Incidentally, the drive circuit 111 may be configured by using a CMOSFET instead of a bipolar transistor.

Figure 3A:
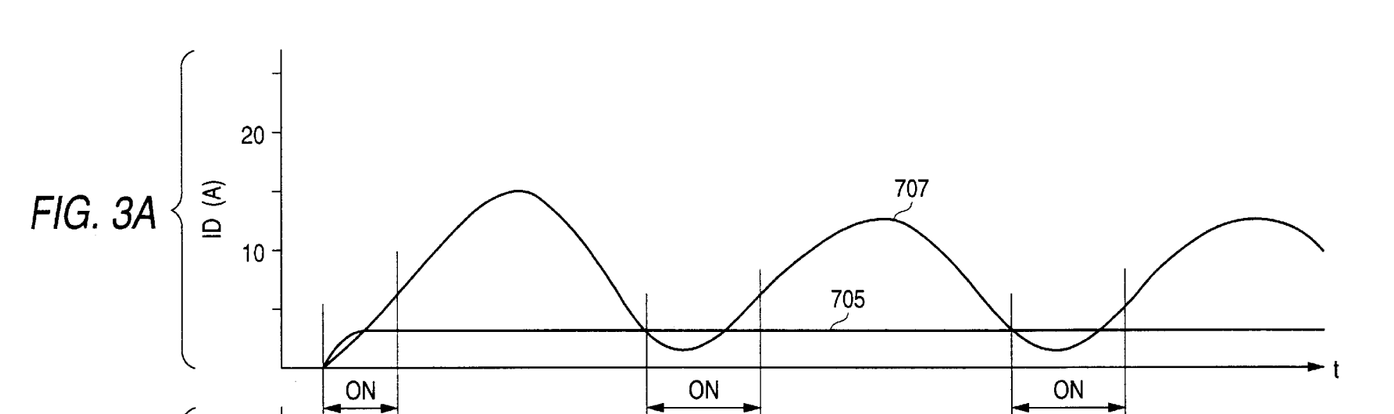
FIG. 3A is a waveform diagram of a load current for explaining the operation of the switching device shown in FIG. 1.
Figure 3B:
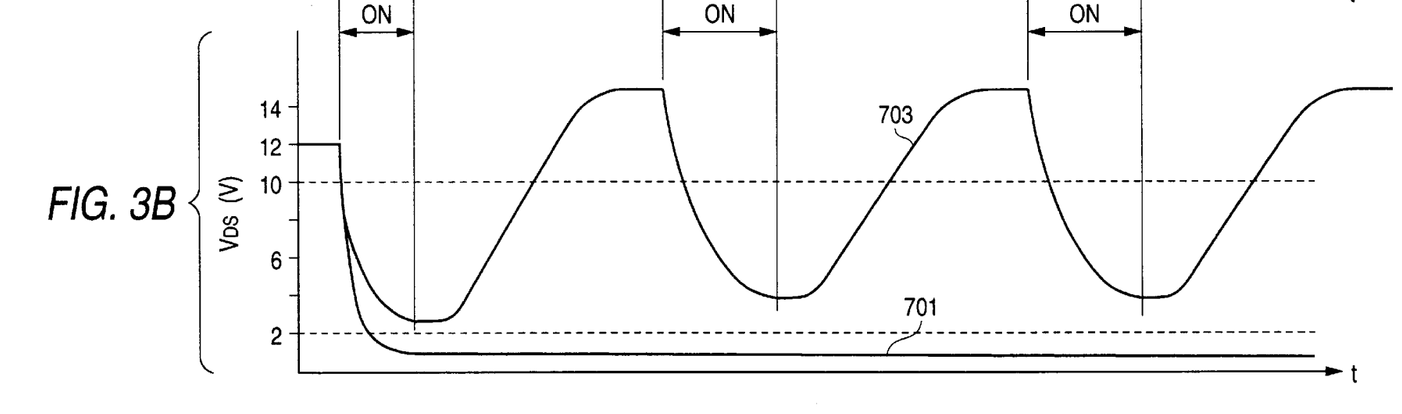
FIG. 3B is a waveform diagram of voltage across drain and source terminals of a FET QA.

When the drive signal (on-pulse signal) from the drive circuit 111 having the above-described configuration is inputted to the gate terminal TG, the FETs QA, QB, and QC conduct, and a voltage 701 between the drain and source electrodes of each FET drops to 2V or less, as shown in FIG. 3. At this time, when the load 102 is in a normal state, the voltage between the drain and source electrodes of each FET is maintained at 2V or less while the drive signal is being outputted from the drive circuit 111, and a drain current 705 at the FET QA is fixed.

Here, if the load 102 or the like becomes short-circuited, a large current flows across the load 102 or the like, so that there is a possibility of the load 102 and the FET QA becoming damaged. Accordingly, an arrangement is adopted in which the source voltages at the FETs QA and QB are monitored by the comparator CMP1, and drive circuit 111 is forcibly stopped from outputting the drive signal when the two voltages have exceeded a threshold level.

Namely, the source voltage from the FET QA is inputted to the plus input terminal of the comparator CMP1, while the source voltage from the FET QB is inputted to its minus input terminal. The comparator CMP1 compares the voltages inputted to its plus input terminal and minus input terminal, and outputs the "H" level output signal when the source voltage at the FET QA is higher than or substantially equal to the source voltage at the FET QB, whereas, when the source voltage at the FET QA has become lower than the source voltage at the FET QB, i.e., when a current larger than normal has flowed across the load 102 and the source voltage at the FET QA has become lower than the source voltage at the FET QB due to the first reference resistor Rr1, i.e., the threshold voltage, then the comparator CMP1 outputs the "L" level output signal to the drive circuit 111 by assuming that an abnormal current has flowed across the FET QA. When the "H" level signal is being inputted from the comparator CMP1, the drive circuit 111 is able to output the drive signal; however, when the "L" level signal is inputted, the drive circuit 111 is forcibly stopped from outputting the drive signal. Thus, the comparator CMP1 serves as a first abnormality determining device for forcibly stopping the drive circuit 111 from outputting the drive signal. It should be noted that if it is assumed that the resistance of the load is L, that the current value to be detected which flows across the load due to an abnormality is α times the current value at normal times, and that ratio in the number of units of the FET QB and the FET QA, i.e., the ratio between the channel widths W is 1:N, the threshold voltage is determined by setting the resistance value of the reference resistor Rr1 to N·L/α.

As for the comparator CMP2 as well, the source voltage from the FET QA is inputted to its plus input terminal, while the source voltage from the FET QC is inputted to its minus input terminal. The comparator CMP2 compares the voltages inputted to its plus input terminal and minus input terminal, and outputs the "L" level output signal when the source voltage at the FET QA is lower than or substantially equal to the source voltage at the FET QC, whereas, when the source voltage at the FET QA is higher than the source voltage at the FET QC, i.e., when the load 102 consists of a plurality of electric bulbs, and a current smaller than normal has flowed due to the disconnection of one bulb, and when the source voltage at the FET QA has become higher than the source voltage at the FET QC due to the second reference resistor Rr2, i.e., the threshold voltage, then the comparator CMP2 outputs the "H" level output signal to the abnormality detecting unit 501 by assuming that an abnormal current has flowed across the FET QA. Thus, the comparator CMP2 serves as a second abnormality determining device for outputting the detection of the abnormality to the abnormality detecting unit 501. It should be noted that if it is assumed that the resistance of the load is L, that the current value to be detected which flows across the load due to an abnormality is $1/\beta$ times the current value at normal times, and that ratio in the number of units of the FET QB and the FET QA, i.e., the ratio between the channel widths W is 1:N, the threshold voltage is determined by setting the resistance value of the reference resistor Rr2 to $\beta \cdot N \cdot L$.

On the other hand, when the FET QA shifts from the on state to the off state, the transistor Q6 is turned on, causing a diode D1 to conduct. As a result, a current flows in the path of the resistor R1 and the diode D1, so that the potential at the plus input terminal of the comparator CMP1 drops to a level lower than when the drive circuit 111 is performing on-control. Accordingly, the FET QA is maintained in the off state immediately after the shift to the off state until a predetermined small difference arises in the drain-source voltage, i.e., until the source voltage at the FET QA becomes substantially equal to the source voltage at the FET QB.

However, even in the case where the FET QA is set in the off state due to such as a shortcircuiting of the wiring, the drain current increases, and the FET QA shifts to the off state after going through a pinchoff region, e.g., after undergoing the operational state in a triode characteristic region. Consequently, the potential at the plus input terminal of the comparator CMP1 becomes high after the lapse of a fixed time, so that the output level of the comparator CMP1 changes from the "L" level to the "H" level, causing the FET QA to shift to the on state again. As shown in FIG. 3, such a periodic transition of a drain-source voltage 703 at the FET QA during the occurrence of an abnormality due to such as the shortcircuiting of the load 102 continues while the switch SW1 is being closed, with the result that a drain current 707 at the FET QA periodically changes. The period of the transition of the drain-source voltage 703 at the FET QA is determined by a time constant based on such as the inductance of the wiring, the wiring resistance, and the capacitor capacity of the FET QA.

Accordingly, the number of times the FET QA is turned on and off is counted, and when this discrete value has reached a set value, the FET QA is forcibly cut off, and this cut-off state is held.

Specifically, the on/off counter circuit 304 and the cutoff latch circuit 306 are provided as circuits for counting the on-off state of the FET QA.

As shown in FIG. 2, the on/off counter circuit 304 comprises bipolar transistors Q41, Q42, and Q43, an n-channel FET Q44, diodes D41, D42, and D43, a zener diode ZD41, and resistors R41 to R46.

The cathode side of the zener diode ZD41 is connected to the source terminal S of the FET QA, and when the voltage at the source terminal S is in a normal state, a forward bias voltage is applied to the base of the transistor Q43, so that the transistor Q43 is in the on state. For this reason, the transistor Q42 is also in the on state. Meanwhile, since the transistor Q41 has its base connected to the output terminal of the drive circuit 111 through the resistor R41 and the diode D42, when the transistor Q5 is on, i.e., when the FET QA is on, the transistor Q41 is in the off state.

On the other hand, when the transistor Q6 is turned on, i.e., when the FET QA is turned off, since the diode D42 is grounded through the transistor Q6, the transistor Q41 is turned on. If the transistor Q41 is turned on, the current from the power supply 101 flows to the capacitor C12 through the transistors Q41 and Q42 and the resistor R44, so that the capacitor C12 is charged.

Next, when the transistor Q5 shifts from the off state to the on state, the transistor Q41 is turned off, and the charge built up in the capacitor C12 is discharged through the resistor R46. Subsequently, when the transistor Q6 is turned on again, and the transistor Q41 is turned on, the capacitor C12 is further charged.

In such a process in which the on-off action is repeated, if the gate voltage at the FET Q44 exceeds a threshold level due to the charge built up in the capacitor C12, the FET Q44 is turned on, causing the diode D42 to conduct. Consequently, both ends of a temperature sensor 121 are shortcircuited through the diode D43, and a latch command signal is outputted to the cutoff latch circuit 306. Namely, the on/off counter circuit 304 serves as a latch commanding device. Incidentally, the time period until the frequency of on-off action reaches a set value can be adjusted by a time constant based on the resistor R46 and the capacitor C12.

The cutoff latch circuit 306 comprises n-channel FETs QS, Q11, Q12, Q13, and Q14, the temperature sensor 121, and resistors R31 to R35, and the FET QS has its drain electrode connected to the gate terminal TG of the FET QA and its source electrode connected to the source terminal S of the FET QA. The temperature sensor 121 includes four diodes connected in series, and is arranged such that when the temperature of the semiconductor chip 110 has exceeded a set temperature, the voltage at its both ends becomes lower than a set voltage. Namely, at normal times, the voltage at both ends of the temperature sensor 121 is set to be higher than the threshold level of the voltage between the source and gate electrodes of the FET Q11, and the FET Q11 is maintained in a normally on state. Then, when the FET Q11 is on, the FET Q14 is maintained in the off state, the FET Q13 is maintained in the on state, and the FETs Q12 and QS are maintained in the off state.

Meanwhile, when the FET Q44 is turned on and both ends of the temperature sensor 121 are shortcircuited through the diode D43, or the temperature of the semiconductor chip 110 has exceeded a set temperature and the voltage at both ends of the temperature sensor 121 has dropped to a level below a set voltage, the FET Q11 shifts from the on state to the off state, and the FET Q14 is turned on. If the FET Q14 is turned on, the FET Q13 is turned on and the FET QS is also turned on, with the result that the source and gate electrodes of the FET QA are shortcircuited by the FET QS, and the FET QA is set in the cutoff state. This shortcircuited state is latched by the FETs Q12 and Q13 serving as the latch circuit. Namely, the cutoff latch circuit 306 serves as a cutoff latch device which sets the FET QA in a nonconducting state and latches this nonconducting state when the frequency of the on-off action counted by the on/off counting circuit 304 has reached a set value, or when the temperature of the semiconductor chip 110 detected by the temperature sensor 121 has exceeded a set temperature due to heating by the current 707 (current oscillation) which periodically changes as described above.

As described above, with the switching device using the semiconductor chip 110, an abnormal current such as an overcurrent or an undercurrent is detected by hardware circuits, and the FET QA can be latched in the nonconducting state in correspondence with the state of the abnormality, a signal representative of the occurrence of the abnormality can be outputted to the outside, e.g., to such as a controlling device for managing the switching of the overall load. Namely, a controlling device such as a microcomputer, an abnormality determining circuit including a shunt resistor, an A/D converter, and the like which are conventionally used become unnecessary, and control for the supply of electric power to the load and the cutting off of the supply of electric power during the occurrence of an abnormality can be effected by the hardware circuits alone. Further, most of the component elements such as the hardware circuits making up the switching device can be integrated in a single semiconductor chip. In short, the switching device can be simplified.

Figure 4:
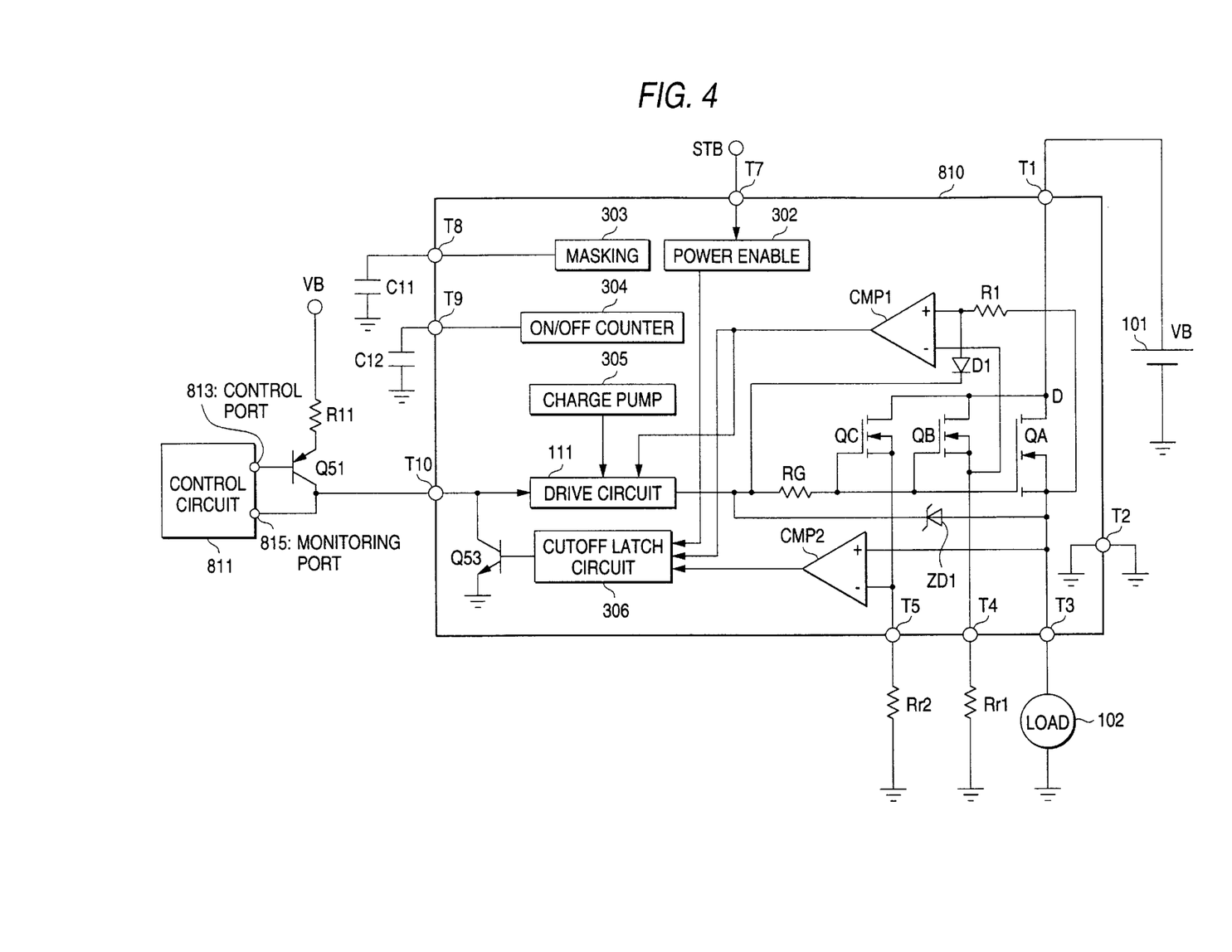
FIG. 4 is a block diagram of the switching device in accordance with another embodiment of the present invention.
Figure 5:
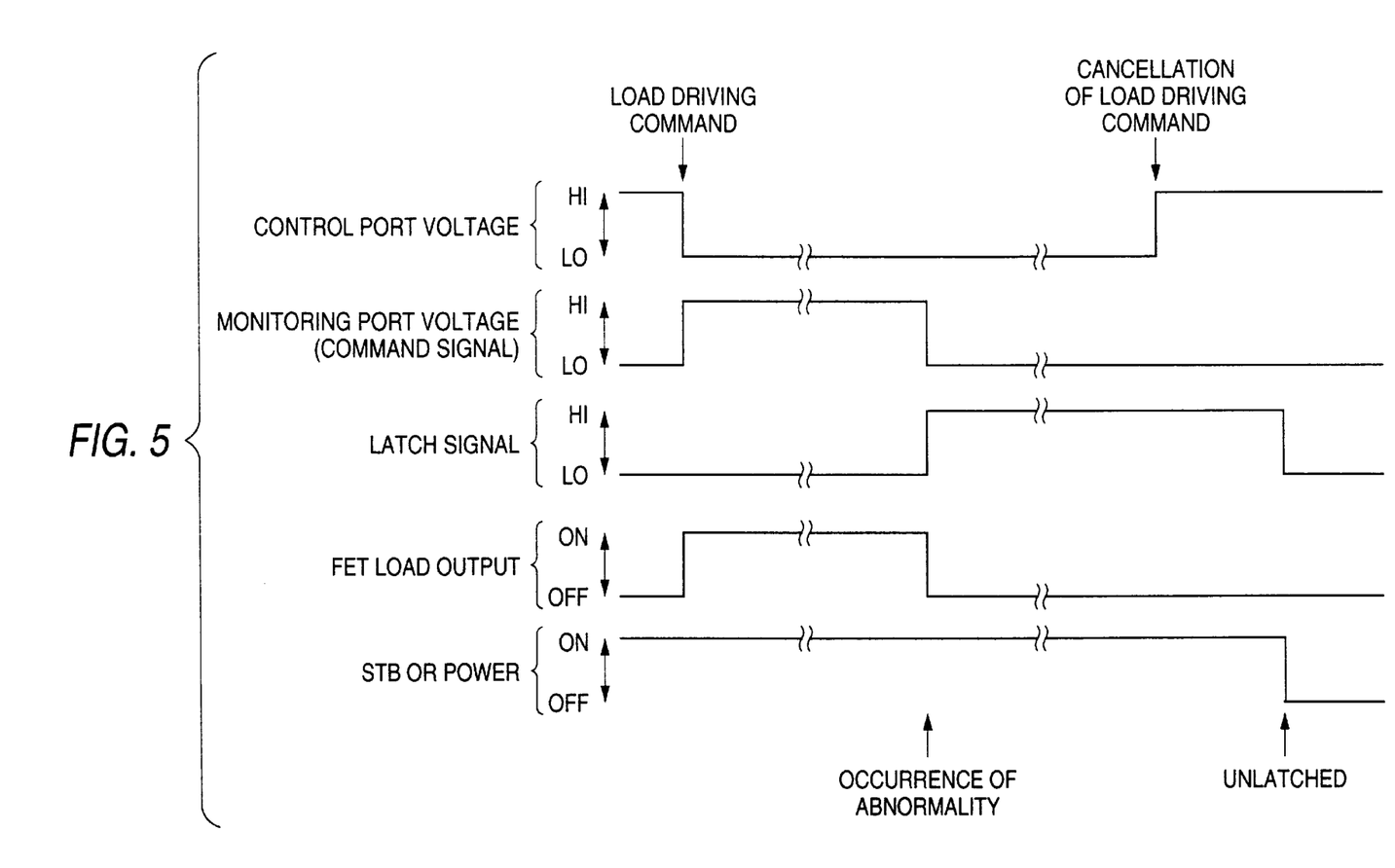
FIG. 5 is a diagram illustrating the voltage at each port, the state of output of the FET load, and the state of the power supply.

Next, referring to FIGS. 4 and 5, a description will be given of another embodiment of the switching device to which the present invention is applied, as well as characteristic portions of the present invention. FIG. 4 is a block diagram of the switching device in accordance with the embodiment. FIG. 5 is a diagram illustrating the voltage at each port, the state of output of the FET load, and the state of the power supply. The switching device in this embodiment in terms of its configuration and operation is basically the same as the above-described switching device shown in FIG. 1; however, as shown in FIG. 4, the switching device in this embodiment has a transistor Q51 instead of the switch SW1, and its base is connected to a control port 813 of a control unit 811 constituted by a microcomputer etc., while its emitter is connected to the resistor R11, and its collector is connected to the terminal T10 for inputting a command signal and to a monitoring port 815 of the control unit 811. Further, unlike the above-described switching device which constitutes the basis of the present invention, the drive circuit 111 in this embodiment is disposed so as to output the drive signal as a high-level command signal is inputted thereto. Further, a semiconductor chip 810 in this embodiment, although basically similar to the above-described semiconductor chip 110 shown in FIG. 1, is so arranged that outputs of the power enable portion 302, the comparator CMP1, and the comparator CMP2 directly are applied to the cutoff latch circuit 306. Further, a transistor Q53 is integrated on the semiconductor chip 810, and has its base connected to a latch signal terminal from the cutoff latch circuit 306, its collector connected to the terminal T10, and its emitter connected to the ground potential. Namely, the control unit 811 and the transistor Q51 function as a commanding device for commanding the driving of the load, and the control unit 811 also functions as a monitoring device for monitoring the state of the load by the state of the command signal. Further, the transistor Q53, together with the cutoff latch circuit, serves as a cutoff latch device. Incidentally, as the transistors Q51 and Q53, it is possible to use CMOSFETS instead of the bipolar transistors.

In the switching device of this embodiment, as shown in FIG. 5, since the control unit 811 commands the driving of the load, if the control port 813 is set to the low level, the transistor Q51 conducts. As the transistor Q51 conducts, the high-level drive command signal is inputted to the drive circuit 111, and the high-level drive signal is outputted from the drive circuit 111 to the FET QA. the FET QA is set in the conducting state by the drive signal, i.e., the load output from the FET QA is set to on. Here, if an abnormality has occurred, in the case of an overcurrent the comparator CMP1 outputs an "L" level determination signal to the cutoff latch circuit 306, and in the case of an undercurrent the comparator CMP2 outputs an "H" level determination signal thereto. Through these determination signals, the cutoff latch circuit 306 outputs a high-level latch signal to the base of the transistor Q53 to cause the transistor Q53 to conduct, which in turn causes the high-level drive command signal inputted to the drive circuit 111 to shift to the ground potential and to be changed to a low-level stop command signal, thereby stopping the output from the drive circuit 111 and latching the FET QA in the nonconducting state. Meanwhile, the control unit 811 monitors the voltage at the terminal T10, i.e., the command signal, at its monitoring port 815. When the voltage at the terminal T10 shifts to the low level, i.e., shifts to the stop command signal while the driving of the load is being commanded at the control port 813, the control unit 811 detects that an abnormality has occurred and that the FET QA has been set in the nonconducting state. After the lapse of a predetermined time duration subsequent to the occurrence of the abnormality, the control unit 811 sets the voltage at the control port 813 to the low level, thereby canceling the command for driving the load. The resetting of the cutoff latch circuit 306, i.e., the cancellation of the latched state, is effected either as the power supply is turned off or as a standby signal is inputted from the terminal T7 to set the power enable portion 302 in the standby mode.

As described above, with the switching device of this embodiment, since the control unit 811 monitors the state of the command signal at the terminal T10 and detects that the FET QA has been set in the nonconducting state, it is possible to disuse the terminal T6 for connecting the abnormality detecting unit 501 for detection of such as undercurrent as well as the terminal T11 for connecting the diagnosis output unit 502. In other words, since it is possible to reduce the number of terminals of the semiconductor chip which increase connections and complicate the device, it is possible to simplify the switching device. In addition, since the cost of the semiconductor chip is proportional to the number of terminals, by reducing the number of terminals, it is possible to lower the cost of the semiconductor chip, i.e., the switching device.

In addition, although in this embodiment the control port 813 and the monitoring port 815 are provided in the control unit 811 which controls the switching of each of the same loads, the control port 813 and the monitoring port 815 may be provided in each separate circuit or a controlling device other than the control unit 811.

In addition, although in this embodiment both the comparator CMP1 and the comparator CMP2 are provided, the comparator CMP2 may not be provided depending on the application of the switching device.

In addition, although the switching device in this embodiment is a dc circuit, the switching device is applicable to an ac circuit as well.

What is claimed is:
1. A switching device, comprising:
   a driving device which outputs a drive signal in response to a drive command signal;

a first switching device inserted in a power supply circuit connecting a power supply and a load, the first switching device being adapted to conduct in response to the drive signal and close the power supply circuit;

a reference resistor which generates a reference voltage by receiving a current from the power supply;

a second switching device inserted in a shunt circuit connecting the power supply and the reference resistor, the second switching device being adapted to conduct in response to the drive signal and close the shunt circuit;

an abnormality determining device which determines an abnormality by comparing an output voltage from the first switching device and the reference voltage so as to stop the driving device from outputting the drive signal;

an on/off counter circuit which outputs a latch command signal when the first switching device has repeated conduction and nonconduction a set number of times in accordance with a state of the load by monitoring a state of the first switching device; and a cutoff latch circuit which renders the first switching device in a nonconducting state in response to the latch command signal and latches the nonconducting state.

2. A switching device, comprising:

a commanding device which commands a driving of a load;

a driving device which outputs a drive signal in response to a drive command signal from the commanding device;

a first switching device inserted in a power supply circuit connecting a power supply and the load, the first switching device being adapted to conduct in response to the drive signal and close the power supply circuit;

a reference resistor which generates a reference voltage by receiving a current from the power supply;

a second switching device inserted in a shunt circuit connecting the power supply and the reference resistor, the second switching device being adapted to conduct in response to the drive signal and close the shunt circuit;

an abnormality determining device which determines an abnormality by comparing an output voltage from the first switching device and the reference voltage;

a cutoff latch device which changes the drive command signal outputted to the driving device into a stop command signal in response to an abnormality determination signal of the abnormality determining device, and latches the stop command signal; and a monitoring device which monitors a state of the load on the basis of one of the drive command signal and the stop command signal inputted to the driving device.

3. The switching device of claim 2, wherein the abnormality determining device includes a first abnormality determining device which determines an abnormality when the output voltage from the first switching device is lower than the reference voltage.

4. The switching device of claim 3, wherein the abnormality determining device includes a second abnormality determining device which determines an abnormality when the output voltage from the first switching device is higher than the reference voltage.

* * * * *